United States Patent
Steiner

(10) Patent No.: US 7,313,179 B1
(45) Date of Patent: Dec. 25, 2007

(54) MINIMIZING WINDOWING EFFECTS IN PARTICULAR FOR SIGNAL RECOVERY

(75) Inventor: Rolf Steiner, Rottenburg (DE)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/069,084

(22) PCT Filed: Dec. 23, 1999

(86) PCT No.: PCT/EP99/10349

§ 371 (c)(1),
(2), (4) Date: May 23, 2002

(87) PCT Pub. No.: WO01/48492

PCT Pub. Date: Jul. 5, 2001

(51) Int. Cl.
*H04B 3/46* (2006.01)
*H04B 17/00* (2006.01)
*H04Q 1/20* (2006.01)

(52) U.S. Cl. .................................................. 375/224
(58) Field of Classification Search ................ 375/295, 375/296, 316, 346, 144, 148, 224, 227, 285; 455/67.11, 67.13, 114.2, 115.1–115.2, 226.1, 455/296

See application file for complete search history.

(56) References Cited

U.S. PATENT DOCUMENTS

| | | | | |
|---|---|---|---|---|
| 5,394,435 A * | 2/1995 | Weerackody | ............... | 375/144 |
| 5,416,847 A * | 5/1995 | Boze | ............... | 381/94.3 |
| 5,519,402 A * | 5/1996 | Kitayoshi | ............... | 342/196 |
| 5,715,319 A * | 2/1998 | Chu | ............... | 381/26 |
| 6,526,105 B1 * | 2/2003 | Harikumar et al. | ............... | 375/350 |
| 6,580,705 B1 * | 6/2003 | Riazi et al. | ............... | 370/347 |
| 6,628,735 B1 * | 9/2003 | Belotserkovsky et al. | .. | 375/355 |
| 6,744,833 B1 * | 6/2004 | Kirkpatrick | ............... | 375/354 |

* cited by examiner

*Primary Examiner*—David C. Payne
*Assistant Examiner*—Aslan Ettehadieh

(57) ABSTRACT

A measured signal, such as a high-speed digital pulse, transmitted through a system is corrected. The measured signal is sampled to a sampled signal sequence, and a signal series is provided as a plurality of the sampled signal sequences put together successively. The signal series is windowed with a window function, and a corrected measured signal is recalculated from the windowed signal series using information about the frequency-dependency of the system.

15 Claims, 2 Drawing Sheets

MINIMIZING WINDOWING EFFECTS IN PARTICULAR FOR SIGNAL RECOVERY

BACKGROUND OF THE INVENTION

The present invention relates to correcting a measured signal transmitted through a system.

Effective and accurate measuring of high-speed pulses requires careful design of the measuring setups and methods. Increased measurement accuracy of signals with increasing frequencies together with a high degree of automatization is getting more and more difficult to achieve. While reaching ranges of above 1 GHz, signal distortion resulting from each connection, cables, switches or other elements in the transmission path is influencing the pulse performances significantly, for example with respect to pulse rise and/or fall time, ringing, droop, overshoot, or the like. Such kind of distortion is generally tried to be minimized by using (usually more expensive) high-speed cables, high-frequency connectors, switches, etc. and/or by optimizing the measurement set-up to minimize signal connection lengths. Moreover, a certain trade off between measurement accuracy and the degree of measurement automatization is often required.

Another approach for improving measuring signals can be accomplished by determining the distortion of the signal transmission path and recalculating an ideal signal (i.e. without being distorted by the signal transmission path) from the actually measured signal. The techniques for recalculating the ideal signal are well established in the theory of communications. The response of a linear system to a signal can be determined in the time domain by using the principle of convolution, and in the frequency domain by applying the principle of superposition to responses produced by the individual frequency components applied for the frequency domain representation. Multiplication in the frequency domain is equivalent to convolution in the time domain, and vice versa. A detailed break down of the theory, both for time domain and frequency domain analysis, can be readily taken e.g. from the introductory chapter "Signals and Channels" in "Telecommunications engineering", ISBN 0-412-38190-7, by J. Dunlop.

For the sake of simplicity and since signal recalculations are mainly applied in the frequency domain, the principle of signal recalculation shall be explained in the following mainly with respect to frequency domain analysis. It is clear, however, that signal recalculations in the time domain applying convolution techniques can be applied accordingly.

FIG. 1 illustrates the principle of signal recalculation in the frequency domain. An input signal 10 provided from a signal source 20 is transmitted through a communication channel generally represented herein as a system 30. In general, the system 30 modifies or distorts the waveform of the input signal 10 transmitted through the system 30 to an output signal 40. The amount of distortion produced by the system 30 is thereby determined by the transfer function (i.e. attenuation and phase shift as a function of frequency) of the system 30. The determination of the transfer function will be explained in more detail with respect to FIG. 2. The output signal 40 is measured by a measuring device 50 such as an oscilloscope.

Before recalculating the input signal 10 from the output signal 40 by a recalculation unit 60, a window function W is usually applied to the measured output signal 40 for reducing spectral leakage effects. Typical window functions are Hanning-Window, Blackman Window, or Hamming Window. The recalculation unit 60 then transforms the windowed signal from the time domain into the frequency domain usually by applying a Fast Fourier Transformation (FFT). The transformed signal is then divided by the transfer function T(f) of the system 30, and the result thereof is retransformed from the frequency domain back into the time domain usually by applying an Inverse Fast Fourier Transformation (IFFT). The result of the retransformation represents a recalculated signal 70, which substantially corresponds to the input signal 10. The recalculated signal 70 might be applied to a signal source 80 for generating a physical signal 90 from the recalculated signal 70 or could be applied for analyzing the recalculated signal 70 with respect to its characteristics and properties.

It is clear that the recalculated signal 70 ideally equals the input signal 10 in case that:
  the transfer function T(f) applied in the recalculation unit 60 fully equals the transfer function of the system 30,
  The transformation and retransformation steps are completely inverse,
  the measuring device 50 and the recalculation unit 60 have no transfer function(s) further modulating the signals, and
  the window function W has no influence on the signals.

It is clear that any deviation from the ideal situation as outlined above will adversely affect the signal recalculation process and lead to deviations of the recalculated signal 70 from the input signal 10.

FIG. 2 illustrates the principle for determining a transfer function. A reference signal generator 100 applies a reference signal 110 to the system 30 for which the transfer function T(f) is to be determined. The reference signal 110 transmitted through the system 30 is distorted to a signal response 120 measured by a first measuring device 130. The measured signal response 120 is modulated by a window function (block W) and transformed into the frequency domain (block FFT) as a function O(f). Accordingly, the reference signal 110 is measured by a second measuring device 140, modulated by a window function (block W) and transformed into the frequency domain (block FFT) as a function I(f). The transfer function T(f) of the system 30 is then determined in a calculation unit 150 by dividing the frequency-transformed signal response O(f) by the frequency-transformed reference signal I(f).

It is clear that—dependent on the characteristics of the respective signals—the window functions W applied in FIGS. 1 and 2 can either be the same or different window functions.

Another way for determining the transfer function T(f) would be to measure the response of the system 30 to an applied Dirac pulse.

As noted above, the frequency domain analysis executed by the recalculation unit 60 in FIG. 1 can also be undertaken in the time domain, since the time domain and the frequency domain are linked by the Fourier transform. In that case, the recalculation unit 60 would provide a convolution analysis, however, leading correspondingly to the recalculated signal 70.

When performing the recalculation as outlined for FIG. 1, several difficulties are encountered:
  Firstly, sampling oscilloscopes are generally applied as standard measurement instruments for characterizing (digital) signals, e.g. for determining overshoot or ringing of a digital pulse. For achieving highest accuracy on signal performance measurements, it is necessary to set the time base of the oscilloscope to a value that shows only a few signal periods or even less than one signal period on the screen. This allows maximizing the sampling density of the measured signal. On the other hand, for performing the frequency transformation (such as FFT) a significant number of periods of the measured signal should be used for minimizing the effect of the signal windowing on the measurement accuracy.

High sampling resolution and to put a huge number of signal periods into one screen shot for minimizing windowing effects, however, are contravening requirements, and a certain trade off between those requirements has to be made. However, it is apparent that any limitation of the sampling accuracy in the measuring process of FIG. 1 will correspondingly lead to a reduced accuracy of the recalculated signal 70 with respect to the input signal 10. Accordingly, any inaccuracy in the sampling process of FIG. 2 (by the measuring devices 130 and 140) will lead to a reduced accuracy of the transfer function T(f), which again reduces the accuracy of the recalculation process in the recalculation unit 60 of FIG. 1.

Secondly, the transfer function T(f) can only be determined for discrete frequencies and a limited frequency range. That means, that if the time base of the measuring device 50 has to be changed, the transfer function should be determined again. That requires a huge effort for characterizing each measurement path for all different time bases used.

Thirdly, even with highest accuracy for the sampling process and determination of the transfer function, the recalculated signal 70 is still slightly distorted under the influence of the windowing function.

Fourthly, the determination of the transfer function is strongly dependent on the quality of the reference signal generator 100 providing the reference signal 110. Any frequency limitation of the reference source 110 will automatically reduce the accuracy of the determined transfer function.

SUMMARY OF THE INVENTION

It is therefore an object of the present invention to provide an improved correction of measured signals. The object is solved by the independent claims. Preferred embodiments are shown by the dependent claims.

According to the invention, the signal correction process can be significantly improved in that—before modulating the corrected measured signal with a window function and recalculating the corrected measured signal—the measured signal is sampled, and the sample sequence is reproduced (preferably copied) to a series of several successive sequences. This signal series of a plurality of the sampled signal sequences is then applied for the windowing process. This allows that the measured signal can be sampled with highest accuracy, while windowing effects can be encountered by choosing a sufficiently high number of the sampled signal sequences put together to the signal series.

Since the invention does not depend on the specific method applied for recalculating corrected measured signals, frequency domain analysis as well as time domain analysis can be applied, as described in the introductory part of the description. Preferably, the recalculation process is performed using a frequency domain transformation of the windowed signal series, and by multiplying the transformed signal series with the inverse transfer function of the system. The result is retransformed into the time domain, and the corrected measured signal can be extracted therefrom preferably by selecting one sequence corresponding to the sequence of the measured signal.

In a preferred embodiment, the corrected signal sequence is selected substantially from a middle range of the signal series resulting from the recalculation process of the windowed signal series.

In another preferred embodiment, a demodulation process inverse to the modulation of the signal series with the window function is applied to the results of the recalculation process of the windowed signal series. This allows further reducing distortion effects resulting from the windowing process.

It is to be understood that the inventive signal sampling and accumulation is not limited to signal recalculations but can be applied in order to reduce windowing effects in any kind of application.

It is clear that the invention can be partly or entirely embodied by one or more suitable software programs, which can be stored on or otherwise provided by any kind of data carrier, and which might be executed in or by any suitable data processing unit.

BRIEF DESCRIPTION OF THE DRAWINGS

Other objects and many of the attendant advantages of the present invention will be readily appreciated and become better understood by reference to the following detailed description when considering in connection with the accompanied drawings. Features that are substantially or functionally equal or similar will be referred to with the same reference sign(s).

DETAILED DESCRIPTION OF THE INVENTION

Figure 2:
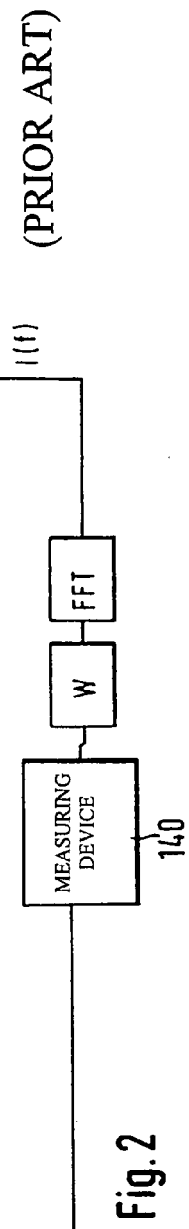
FIG. 2 illustrates the principle for determining a transfer function.
Figure 3:
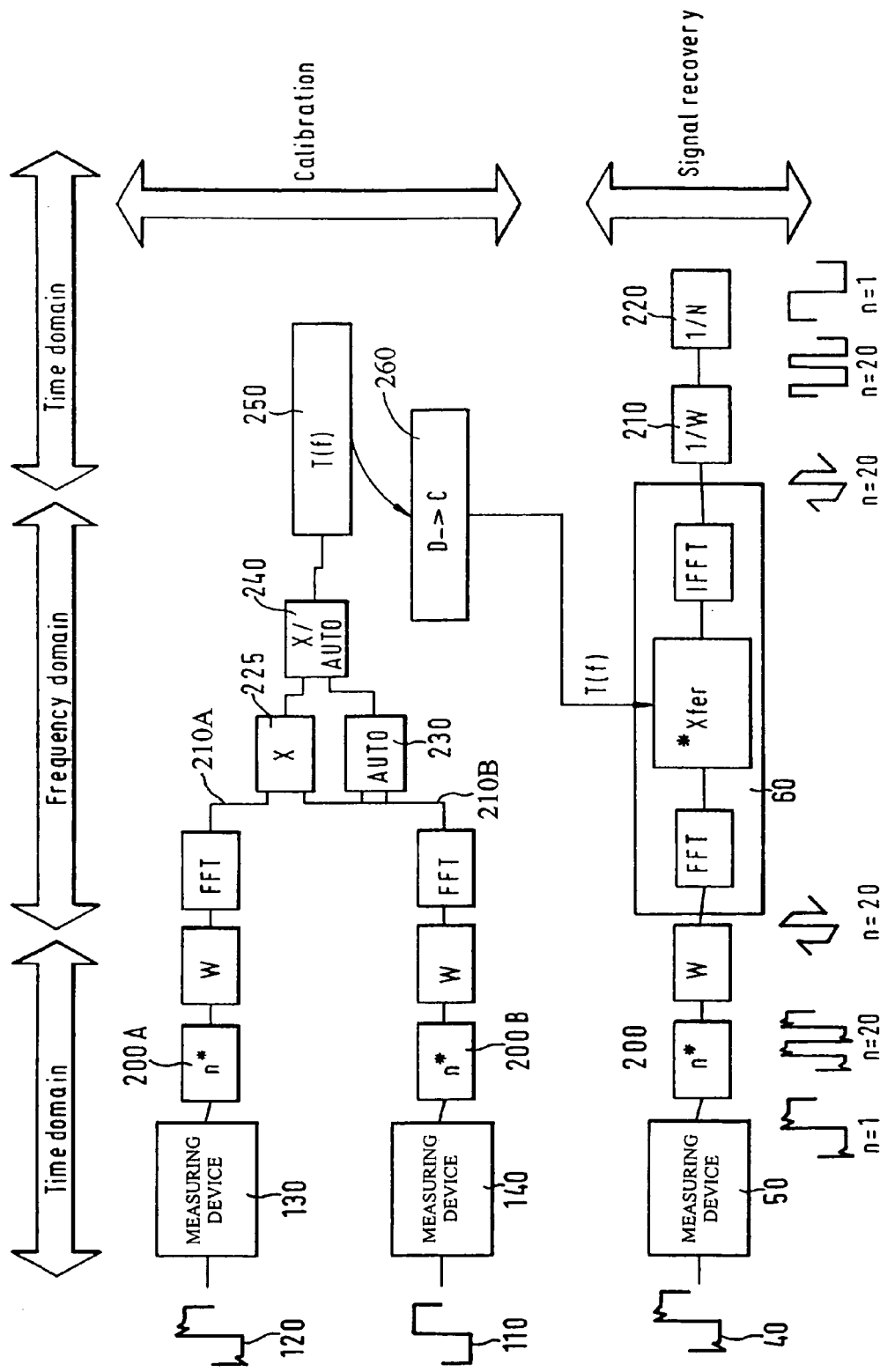
FIG. 3 shows a preferred embodiment of the invention.

FIG. 3 shows a preferred embodiment of the invention, whereby the lower part depicts the signal recovery process for correcting a measured signal, and the upper part illustrates the calibration process for determining the transfer function for the signal recovery process. FIG. 3 substantially corresponds to the measuring principles as depicted for FIGS. 1 and 2.

Figure 1:
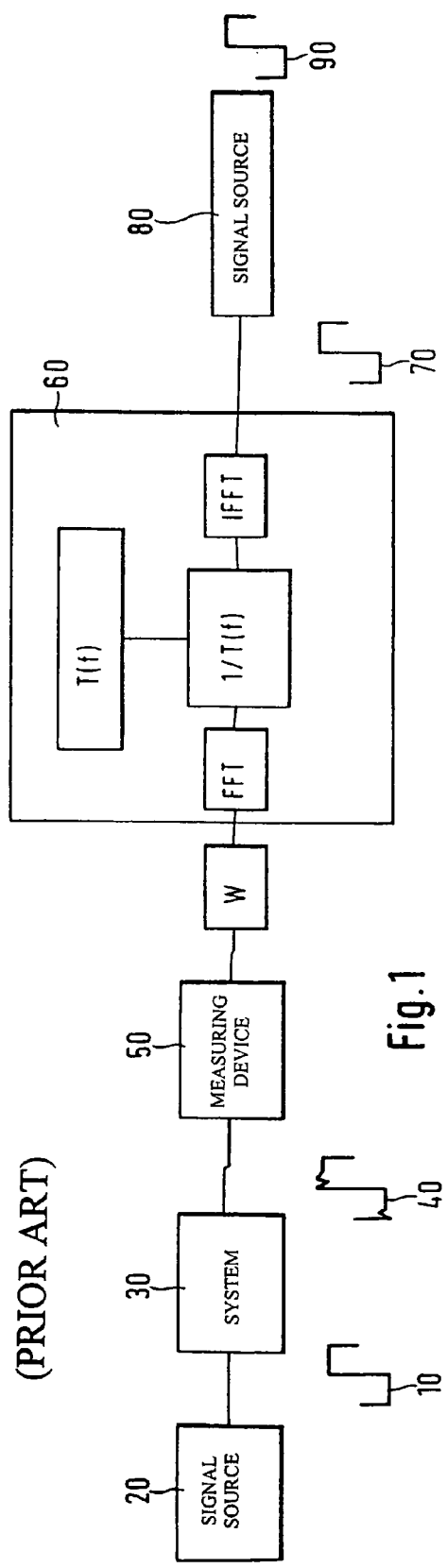
FIG. 1 illustrates the principle of signal recalculation in the frequency domain.

The measuring device 50 in FIG. 3, as explained for FIG. 1, measures and samples the output signal 40 of the system 30. However, in contrast with the explanation as given for FIG. 1, the output signal 40 can be sampled with highest accuracy as provided by the measuring device 50. This allows that sampling distortion can be minimized to a high degree. In case of a periodic output signal, e.g. one period can be sampled with maximum sample density for achieving highest accuracy.

The sampled output signal 40 is then applied to a signal multiplication unit 200, which captures the sampled output signal 40 and appends it thereto (n–1)-times. This results in an n-periodic signal, whereby each period represents the sampled output signal 40. In the example of FIG. 3, the sampled output signal 40 is added (or copied) nineteen times to the "original" sampled output signal 40, thus resulting in a 20-periods signal The n-period signal provided from the multiplication unit 200 is then modulated with a window function W and supplied to the recalculation unit 60. The recalculation unit

60, as explained for FIG. 1, provides a Fourier transform (block FFT) of the windowed n-period signal, divides (block *Xfer) the frequency transformed signal by the transfer function T(f) of the system 30, and finally retransforms (block IFFT) the result back into the time domain.

The recalculated n-periodic signal provided from the recalculation unit 60 now contains n-times the recalculated signal 70, which again can be received e.g. by selecting one period.

In a preferred embodiment, the recalculated n-period signal provided from the recalculation unit 60 will be demodulated from the windowing function W in a demodulation unit 210. The demodulation unit 210 preferably divides the n-period signal from the recalculation unit 60 by the windowing function W (as applied in the previous windowing process).

In another embodiment, the n-periodic signal from the recalculation unit 60 is applied either directly or via the demodulation unit 210 to a period selection unit 220. The period selection unit 220 selects one period of the n-periodic signal, preferably in a middle range of the n-periodic signal. In the example of FIG. 3, the period selection unit 220 will select the eleventh period of the 20-period signal.

The upper part of FIG. 3 illustrates the calibration process preferably applied for determining the transfer function T(f) of the system 30. It is clear, however, that the transfer function T(f) can also be determined by other processes as known in the art, and that the invention is not limited to the specific embodiment as depicted in the upper part of FIG. 3. In accordance with the above said for FIG. 2, the first measuring device 130 measures and samples the signal response 120 of the system 30, while the second measuring device 140 measures and samples the reference signal 110 applied to the system 30. Also in accordance with the above said, a multiplication unit 200A provides an n-period signal from the sampled signal response 120, and a multiplication unit 200B provides an n-period signal from the sampled reference signal 110. The signal response 120 as well as the reference signal 110 are preferably sampled with highest accuracy achievable by the measuring devices 130 and 140. The n-periods signals from the multiplication units 200A and 200B are each modulated with a window function W and transformed into the frequency domain, as indicated by the respective blocks W and FFT, to a transformed signal response 210A and a transformed reference signal 210B.

The transfer function T(f) can then be determined by dividing the transformed signal response 210A by the transformed reference signal 210B. However, instead of directly dividing the transformed signal response 210A by the transformed reference signal 210B, a cross spectrum and an auto spectrum can be determined, as shown in the upper part of FIG. 3. A cross spectrum unit 225 determines the cross spectrum by complex multiplying the spectra of the transformed signal response 210A and the transformed reference signal 210B. An auto spectrum unit 230 determines the auto spectrum by complex multiplying the spectrum of the transformed reference signal 210B with itself. A transfer function determining unit 240 can then determine the transfer function T(f) by dividing the determined cross spectrum by the determined auto spectrum. This allows eliminating white noise effects thus increasing accuracy.

The determined transfer function T(f) is then preferably stored in a storage 250 and can be used by the recalculation unit 60.

In a preferred embodiment, an interpolation unit 260 provides an interpolation of the transfer function T(f) from discrete frequency values to a continued frequency spectrum. This is preferably accomplished by a linear interpolation between two discrete frequency points or a spline interpolation.

The invention claimed is:

1. A method for correcting a measured signal transmitted through a system, said method comprising:
    sampling said measured signal to yield a sampled signal sequence;
    reproducing said sampled signal sequence to yield a plurality of copies of said sampled signal sequence;
    appending said plurality of copies to one another to yield a signal series;
    windowing said signal series with a window function to yield a windowed signal series; and
    recalculating a corrected measured signal from said windowed signal series using information about a frequency-dependency of said system.

2. The method of claim 1, wherein said recalculating a corrected measured signal from said windowed signal further comprises:
    transforming said windowed signal series from a time domain into a frequency domain to yield a transformed signal series;
    modifying said transformed signal series with a transfer function as a function of frequency of said system to yield a modified transformed signal series;
    re-transforming said modified transformed signal series back from said frequency domain into said time domain to yield a re-transformed signal series; and
    receiving said corrected measured signal from said re-transformed signal series.

3. The method of claim 1, wherein said recalculating a corrected measured signal from said windowed signal further comprises modifying said corrected measured signal with a function inverse to said window function.

4. The method of claim 2, wherein said receiving said corrected measured signal from said re-transformed signal series further comprises selecting a corrected signal sequence from said re-transformed signal series substantially corresponding to said sampled signal sequence.

5. The method of claim 4, wherein said selected corrected signal sequence is selected substantially from a middle range of said re-transformed signal series.

6. The method according to claim 1, wherein said sampling said measured signal is executed by a measuring device at a highest accuracy provided by said measuring device.

7. The method of claim 1, wherein said measured signal is a high speed digital pulse.

8. A method for correcting a measured signal transmitted through a system having a transfer function as a function of frequency, said method comprising:
    sampling said measured signal to yield a sampled signal sequence;
    reproducing said sampled signal sequence to yield a plurality of copies of said sampled signal sequence;
    appending said plurality of copies to one another to yield a signal series;
    windowing said signal series with a window function to yield a windowed signal series;
    transforming said windowed signal series from a time domain into a frequency domain to yield a transformed signal series;
    modifying said transformed signal series with said transfer function of said system to yield a modified transformed signal series;

re-transforming said modified transformed signal series back from said frequency domain into said time domain to yield a re-transformed signal series; and receiving a corrected measured signal from said re-transformed signal series.

9. The method of claim 8, wherein said measured signal is a high speed digital pulse.

10. A method for providing a measured signal for further processing, said method comprising:

sampling said measured signal to yield a sampled signal sequence;

reproducing said sampled signal sequence to yield a plurality of copies of said sampled signal sequence;

appending said plurality of copies to one another to yield a signal series; and processing said signal series to determine a characteristic of said measured signal.

11. The method of claim 10, wherein said measured signal is a high speed digital pulse.

12. A storage medium having a program encoded thereon that is executable in a processor to perform a method that includes:

sampling a measured signal that is transmitted through a system, to yield a sampled signal sequence;

reproducing said sampled signal sequence to yield a plurality of copies of said sampled signal sequence;

appending said plurality of copies to one another to yield a signal series;

windowing said signal series with a window function to yield a windowed signal series; and recalculating a corrected measured signal from said windowed signal series using information about a frequency-dependency of said system.

13. An apparatus for executing a method for correcting a measured signal, said apparatus comprising:

a sampling device for sampling said measured signal to yield a sampled signal sequence;

a signal multiplication unit for reproducing said sampled signal sequence to yield a plurality of copies of said sampled signal sequence, and appending said plurality of copies to one another to yield a signal series;

a device for performing windowing functions for windowing the signal series with a window function to yield a windowed signal series; and a recalculation unit for recalculating a corrected measured signal from said windowed signal series using information about a frequency-dependency of said system.

14. An apparatus for correcting a measured signal transmitted through a system comprising:

means for sampling said measured signal to yield a sampled signal sequence;

means for reproducing said sampled signal sequence to yield a plurality of copies of said sampled signal sequence;

means for appending said plurality of copies to one another to yield a signal series;

means for windowing said signal series with a window function to yield a windowed signal series; and means for recalculating a corrected measured signal from said windowed signal series using information about a frequency-dependency of said system.

15. The apparatus of claim 14, wherein said measured signal is a high speed digital pulse.

* * * * *